United States Patent
Zortea et al.

(10) Patent No.: US 9,344,272 B1
(45) Date of Patent: *May 17, 2016

(54) PARALLEL REPLICA CDR TO CORRECT OFFSET AND GAIN IN A BAUD RATE SAMPLING PHASE DETECTOR

(71) Applicant: PMC-Sierra, Inc., Sunnyvale, CA (US)

(72) Inventors: Anthony Eugene Zortea, Pipersville, PA (US); William D. Warner, Maple Ridge (CA)

(73) Assignee: Microsemi Storage Solutions, Inc., Aliso Viejo, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/605,884

(22) Filed: Jan. 26, 2015

Related U.S. Application Data (63) Continuation of application No. 13/549,134, filed on Jul. 13, 2012, now Pat. No. 8,942,334.

(60) Provisional application No. 61/507,428, filed on Jul. 13, 2011.

(51) Int. Cl.
  *H04L 7/00* (2006.01)
  *H04L 7/033* (2006.01)
  *H04L 7/04* (2006.01)

(52) U.S. Cl.
  CPC .............. *H04L 7/0337* (2013.01); *H04L 7/042* (2013.01)

(58) Field of Classification Search
  CPC ............................. H04L 7/0338; H04L 7/0337
  USPC ......................................................... 375/355
  See application file for complete search history.

(56) References Cited

U.S. PATENT DOCUMENTS

| | | |
|---|---|---|
| 5,585,975 A | 12/1996 | Bliss |
| 6,618,436 B2 | 9/2003 | Greiss et al. |
| 7,292,662 B2 * | 11/2007 | Gregorius ..................... 375/350 |
| 7,489,749 B2 | 2/2009 | Liu |
| 7,564,866 B2 | 7/2009 | Agazzi et al. |
| 7,646,807 B1 | 1/2010 | Manickam et al. |
| 7,873,073 B2 * | 1/2011 | Frlan et al. .................... 370/466 |
| 8,559,582 B2 * | 10/2013 | Hoang .......................... 375/376 |
| 2004/0223568 A1 | 11/2004 | Liu |
| 2005/0185742 A1 | 8/2005 | Liu |

(Continued)

OTHER PUBLICATIONS

Mueller, et al.; Timing Recovery in Digital Synchronous Data Receivers; IEEE Transactions on Communications; May 1976; pp. 516-531; vol. COM-24, No. 5.

(Continued)

*Primary Examiner* — Santiago Garcia (57) ABSTRACT

Apparatus and methods reduce channel-dependent phase detector offset and/or gain errors. A conventional Mueller-Muller phase detector places a main cursor at the midpoint of a pre-cursor and a post-cursor. However, for example, when the impulse response of an associated transmission line is not symmetric, the main cursor can be misaligned by conventional Mueller-Muller techniques. By providing a replica clock and data recovery path, trial and error experiments on the phase detector offset and/or gain can be performed, and relatively good values found for the phase detector offset and/or gain without disturbing the reception of data by the phase detector that is being used to receive data. These settings can then be used by the phase detector that is being used to receive data, which can improve the bit error rate of the phase detector.

14 Claims, 9 Drawing Sheets

(56) References Cited

U.S. PATENT DOCUMENTS

| | | | |
|---|---|---|---|
| 2007/0065157 A1* | 3/2007 | Katagiri et al. | 398/155 |
| 2008/0130810 A1* | 6/2008 | Bae | 375/355 |
| 2008/0137790 A1 | 6/2008 | Cranford et al. | |
| 2008/0219390 A1 | 9/2008 | Simpson et al. | |
| 2009/0080584 A1* | 3/2009 | Hamano et al. | 375/371 |
| 2009/0135894 A1 | 5/2009 | Huang | |
| 2009/0304064 A1 | 12/2009 | Liu et al. | |
| 2010/0080282 A1 | 4/2010 | Zhong et al. | |
| 2010/0103003 A1 | 4/2010 | Deval et al. | |
| 2010/0135676 A1* | 6/2010 | Katagiri | 398/204 |
| 2010/0241918 A1* | 9/2010 | Nedovic | 714/746 |
| 2010/0289544 A1 | 11/2010 | Lee et al. | |
| 2011/0064176 A1* | 3/2011 | Takada | 375/355 |
| 2012/0063556 A1* | 3/2012 | Hoang | 375/371 |
| 2012/0163815 A1* | 6/2012 | Mori et al. | 398/51 |
| 2012/0314825 A1* | 12/2012 | Dillinger | 375/371 |
| 2013/0148712 A1* | 6/2013 | Malipatil et al. | 375/233 |

OTHER PUBLICATIONS

USPTO; Examiner's Answer dated Aug. 14, 2014, from related U.S. Appl. No. 13/549,104, filed Jul. 13, 2012.

USPTO; Office Action dated Aug. 29, 2013, from related U.S. Appl. No. 13/549,104, filed Jul. 13, 2012.

USPTO; Office Action dated Jan. 6, 2014, from related U.S. Appl. No. 13/549,104, filed Jul. 13, 2012.

USPTO; Office Action dated Aug. 1, 2013, from related U.S. Appl. No. 13/549,030, filed Jul. 13, 2012.

USPTO; Office Action dated Dec. 19, 2013, from related U.S. Appl. No. 13/549,134, filed Jul. 13, 2012.

USPTO; Office Action dated May 28, 2014, from related U.S. Appl. No. 13/549,134, filed Jul. 13, 2012.

* cited by examiner

PARALLEL REPLICA CDR TO CORRECT OFFSET AND GAIN IN A BAUD RATE SAMPLING PHASE DETECTOR

CROSS-REFERENCE TO RELATED APPLICATION

This application is a continuation application of U.S. application Ser. No. 13/549,134, filed Jul. 13, 2012, now U.S. Pat. No. 8,942,334, issued Jan. 27, 2015, which claims the benefit under 35 U.S.C. §119(e) of U.S. Provisional Application No. 61/507,428, filed Jul. 13, 2011, the entirety of each of which is hereby incorporated by reference.

This application is related to commonly-owned copending application titled "Parallel Replica CDR to Reduce or Minimize ADC and DSP Complexity," having Ser. No. 13/549,104 filed on Jul. 13, 2012; to U.S. Provisional Application No. 61/507,435 filed Jul. 13, 2011; to commonly-owned application titled Gain Calibration for a Mueller-Muller Type Timing Error Detector, Ser. No. 13/549,030, filed Jul. 13, 2012, now U.S. Pat. No. 8,693,596; and to U.S. Provisional Application No. 61/509,914, filed on Jul. 20, 2011, titled Gain Calibration for a Mueller-Muller Type Timing Error Detector, the disclosures of each of which are hereby incorporated by reference in its entirety herein.

BACKGROUND

1. Field of the Invention

Embodiments of the invention generally relate to electronics, and in particular, to data communication links.

2. Description of the Related Art

Figure 1:
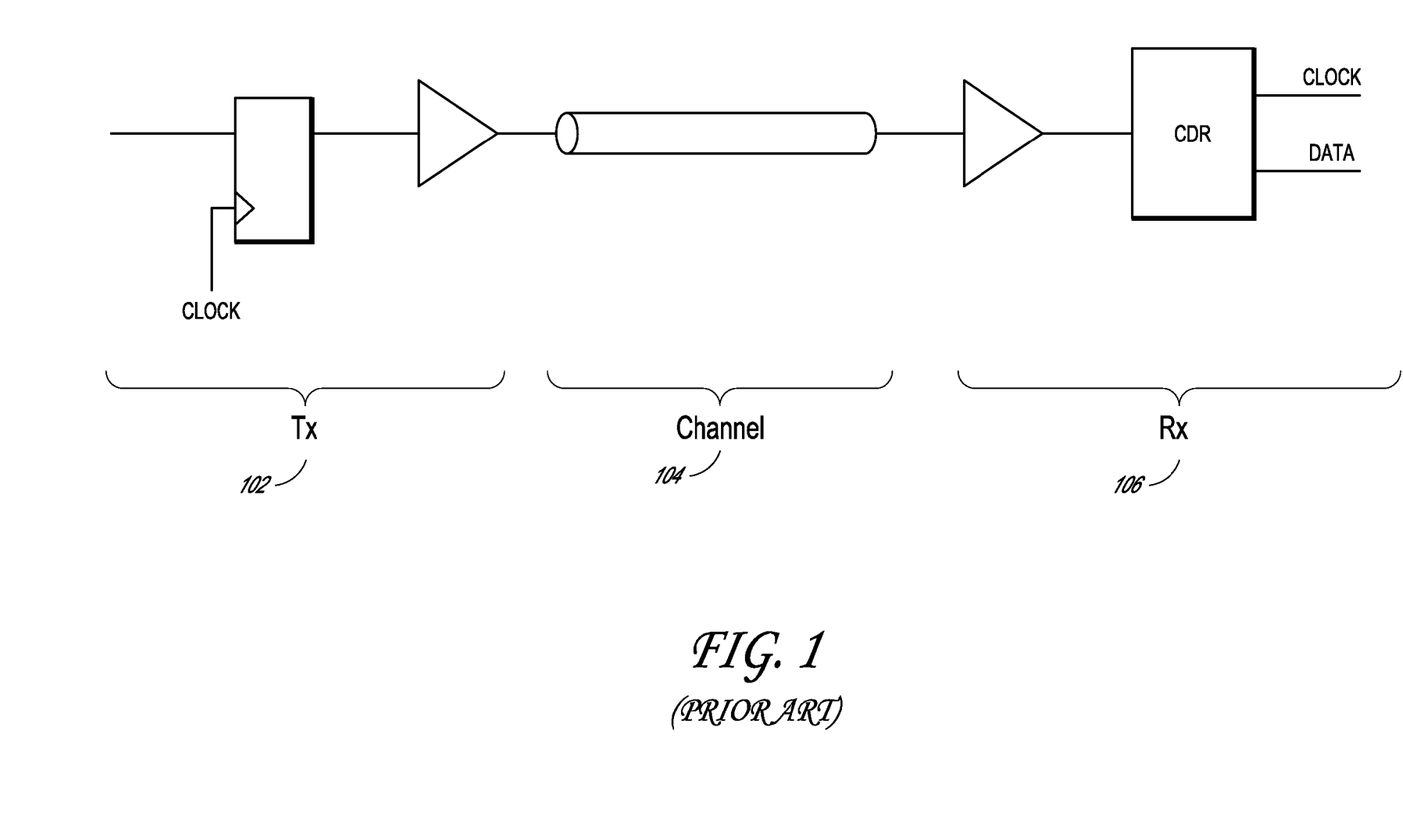
FIG. 1 illustrates an example of a serial communication link with clock and data recovery (CDR).

FIG. 1 illustrates an example of a serial communication link with clock and data recovery (CDR). A physical layer of a computer network includes the underlining physical devices of the computer network. For example, with reference to FIG. 1, at the physical layer, a serial data communication link can include: a transmitter (Tx) 102, a communication channel 104, and a receiver (Rx) 106.

The transmitter (Tx) 102 converts a clocked digital data stream to an analog stream (thereby embedding a clock signal in the serial data stream). The communication channel 104 can introduce linear distortion, non-linear distortion, and noise. The receiver (Rx) 106 recovers the embedded clock signal and data from the distorted serial data stream.

Figure 2:
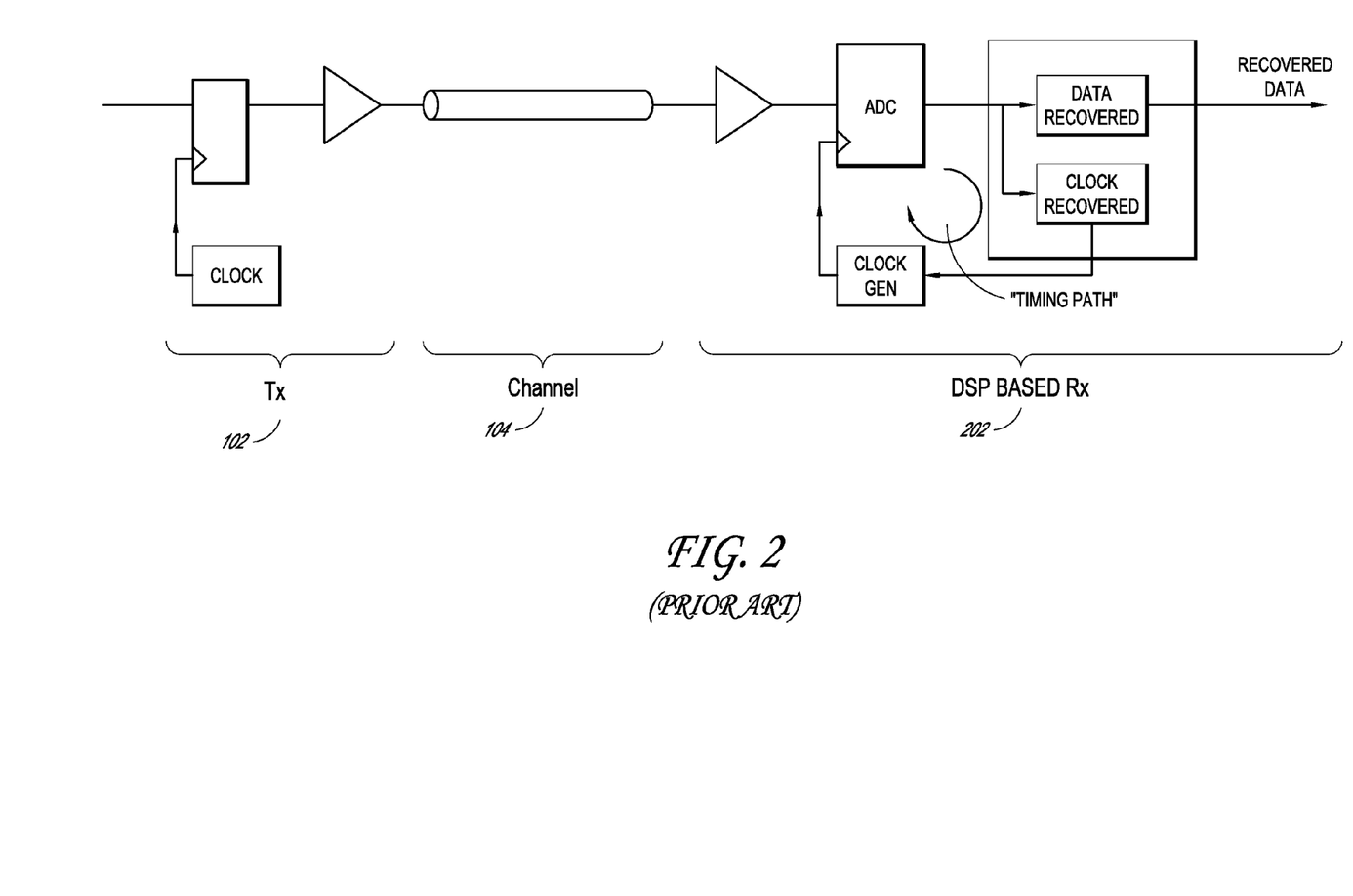
FIG. 2 illustrates an example of a serial communication link with an ADC and DSP based clock and data recovery.

A serial data communication link can also use an analog-to-digital converter (ADC) and digital signal processor (DSP)-based clock and data recovery (CDR) receiver 202 as illustrated in FIG. 2. In the CDR receiver 202, the distorted serial data stream is converted from analog to digital via the ADC, and then the digital version of the distorted serial data stream is processed in digital domain to extract the data and the embedded clock signal.

Figure 3A:
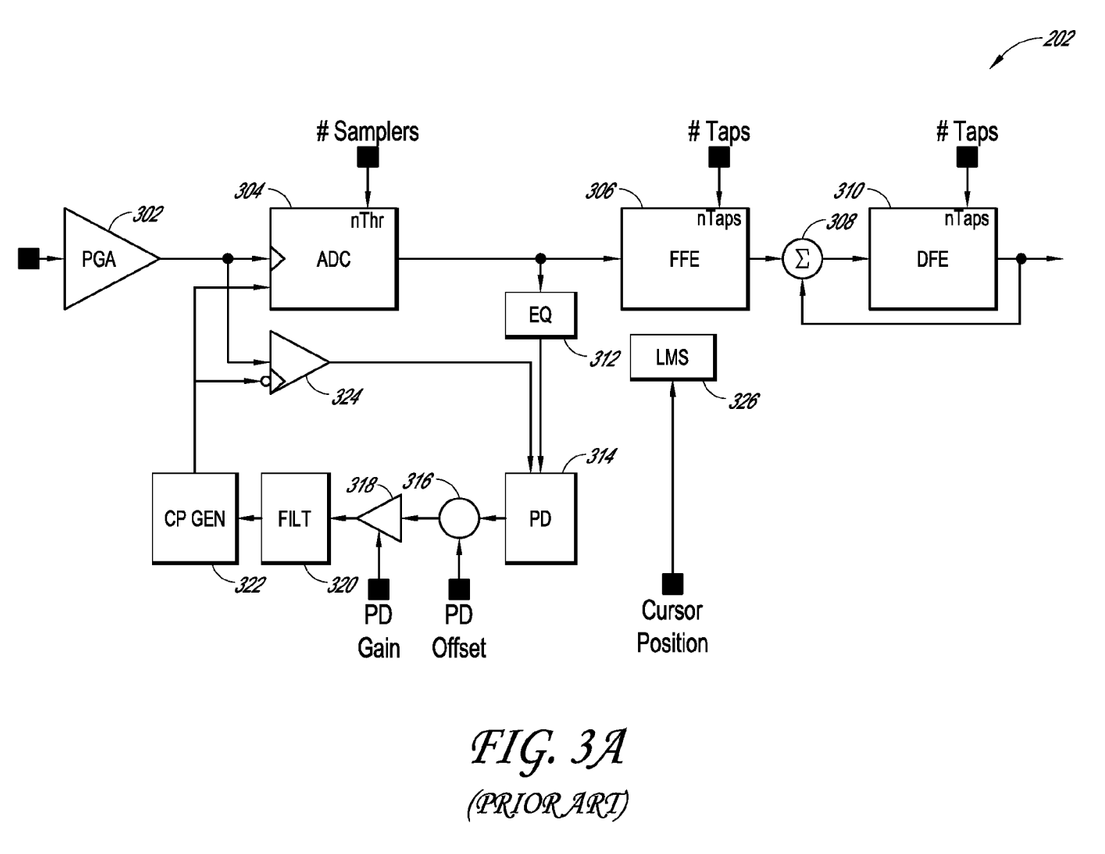
FIG. 3A illustrates a receiver for clock and data recovery.

FIG. 3A illustrates further details of one example of the CDR receiver 202. The illustrated CDR receiver 202 includes a programmable gain amplifier (PGA) 302, an analog-to-digital converter (ADC) 304 a feedforward equalizer (FFE) 306, a first summing circuit 308, a decision feedback equalizer (DFE) 310, an equalizer 312, a phase detector (PD) 314, a second summing circuit 316, an amplifier 318, a filter 320, a clock pulse (CP) generator 322, a slicer 324, and a least means squares (LMS) adaptation processor 326. Some of the components illustrated in FIG. 3A can be optional.

The CDR receiver 202 operates as follows. The PGA 302 receives and amplifies the distorted serial data stream. The gain of the PGA 302 can be adjusted. The ADC 304 converts the distorted serial data stream from analog to digital. While the output of the ADC 304 may be digital, the data stream is still in soft symbol form and has not yet been sliced to hard symbols. The digital version of the distorted serial data stream is then provided as an input to the FFE 306 and to the equalizer 312. For example, the FFE 306 can provide equalization, such as pre-emphasis, that is complementary to the characteristics of the communication channel 104 (FIG. 2), which typically has a low-pass characteristic. The DFE 310 and the first summing circuit 308 can provide additional equalization that is dependent on one or more prior symbols to reduce inter symbol interference (ISI). The LMS adaptation processor 326 can adjust filter coefficients of the FFE 306 and/or the DFE 310. The output of the DFE 310 can then be sliced to convert symbols from soft symbols to hard symbols for decoding of data symbols.

The equalizer 312 can also provide equalization for the timing recovery path and provide an equalized signal as an input to the PD 314. The equalizer 312 is typically smaller and lower power than the equalizers 306, 310 of the data recovery path. The PD 314 determines a phase difference between the equalized signal and an output of the slicer 324. The output of the PD 314 is summed with a PD offset, then amplified by a PD gain, then low-pass or band-pass filtered by the filter 320, which then controls the CP generator 322. The CP generator 322 can be implemented in a variety of ways. For example, the CP generator 322 can be a numerically controlled oscillator (NCO) controlled by the output of the filter 320. In another example, the CP generator 322 can be a phase interpolator that receives a fixed clock frequency input and generates a different phase of that input fixed clock. The output of the CP generator 322 corresponds to the recovered clock signal.

Figure 3B:
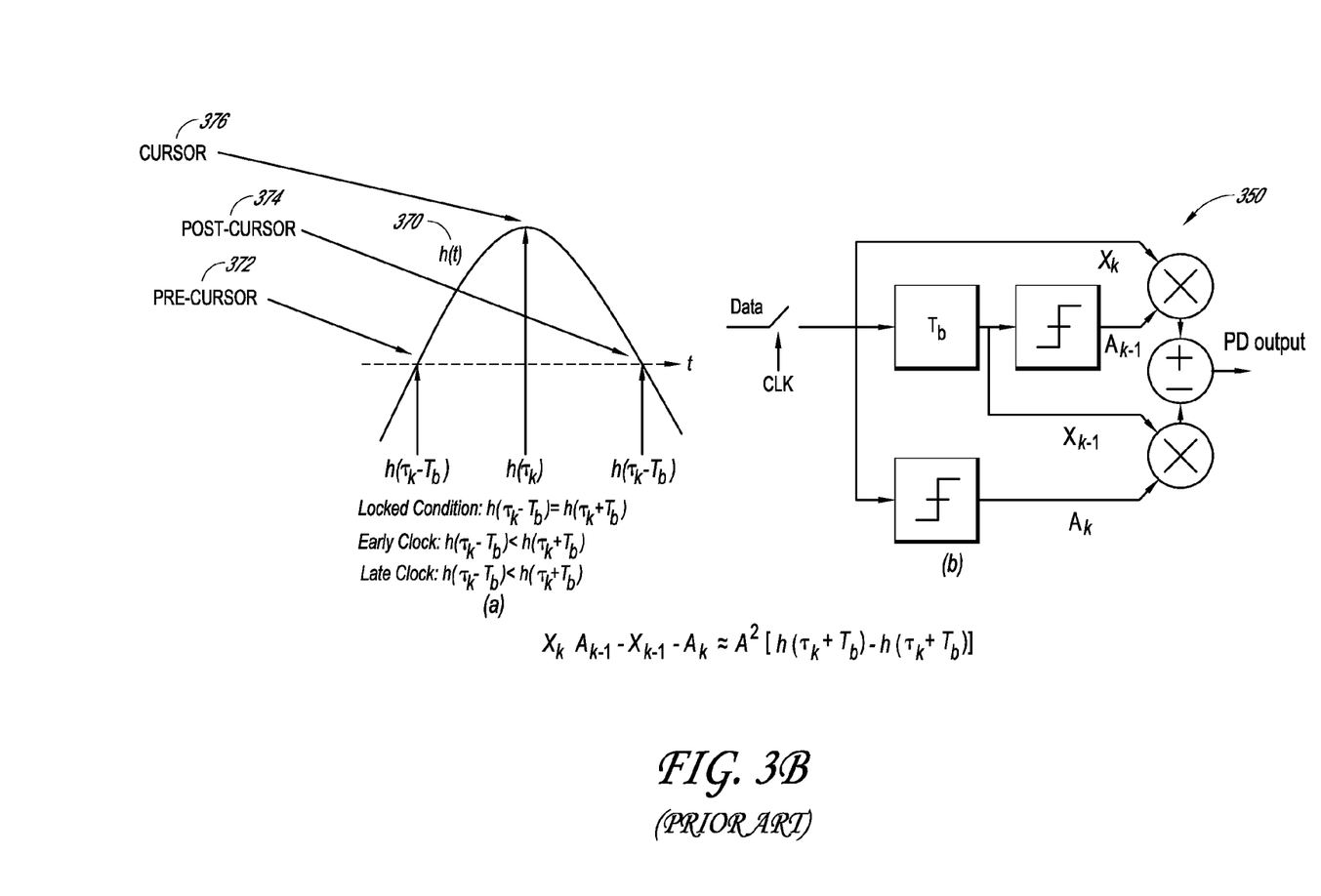
FIG. 3B illustrates Mueller-Muller timing recovery.

FIG. 3B illustrates a Mueller-Muller phase detector. See, MUELLER, K. and MULLER, M., *Timing Recovery in Digital Synchronous Data Receivers*, IEEE Transactions on Communications, May 1976. That paper describes a timing recovery loop that is used in many baud-rate sampling serial links.

For timing recovery, a Mueller-Muller phase detector 350 first estimates the impulse response of the channel 104 (FIG. 1). It should be noted that the impulse response of the channel 104 is typically not directly available. Rather, the digitized data stream is typically all that is observable. Mueller-Muller then outline various ways to use a sampled impulse response h(t) 370 for phase detection; the most common way is to achieve phase lock by forcing the pre-cursor sample 372 and the post-cursor sample 374 of the sampled impulse response h(t) 370 to be at the same level. If the sampled impulse response h(t) 370 is symmetric about the cursor, this should force the main cursor sample 376 to be located right on the peak, which is considered to be desirable in the prior art.

SUMMARY OF THE DISCLOSURE

Improving upon the performance of the Mueller and Muller phase detector is one aspect of embodiments of the invention. A conventional Mueller-Muller phase detector places a main cursor at the midpoint of a pre-cursor and a post-cursor. However, when the impulse response of an associated transmission line is not symmetric, the main cursor can be misaligned by conventional Mueller-Muller techniques. By providing a replica clock and data recovery path, trial and error experiments on the phase detector offset and/or gain can be performed, and relatively good values found for the phase detector offset and/or gain without disturbing the reception of data by the phase detector that is being used to receive data. These settings can then be used by the phase detector that is being used to receive data, which can improve the bit error rate of the phase detector and corresponding clock and data recovery circuit.

One embodiment includes an apparatus, wherein the apparatus includes: a first clock and data recovery circuit having an input and an output, wherein the input is coupled to an input node, wherein the first clock and data recovery circuit has a first phase detector with at least one of an adjustable offset or an adjustable gain; a second clock and data recovery circuit having an input and an output, wherein the input is coupled to the input node, wherein the second clock and data recovery circuit has a second phase detector with at least one of an adjustable offset or an adjustable gain; and a control circuit communicatively coupled to each of the first clock and data recovery circuit and the second clock and data recovery circuit for control of at least one or the offset or the gain settings of phase detectors of the clock and data recovery circuits, wherein the control circuit is coupled to at least the output of the second clock and data recovery circuit; wherein the output of the first clock and data recovery circuit is at least temporarily configured to provide recovered data as an input to circuits other than the control circuit while at least one of the one or more configurable characteristics of the second clock and data recovery circuit is being adaptively adjusted by the control circuit.

In one embodiment, the apparatus includes portions of the first clock and data recovery circuit and the second clock and data recovery circuit and the control circuit. For example, the included portions can include equalizers, phase detectors, filters, and CP generators. The portions of the first clock and data recovery circuit and the second clock and data recovery circuit can further include analog to digital converters. The portions of the first clock and data recovery circuit and the second clock and data recovery circuit can further include programmable gain amplifiers.

One embodiment includes a method for setting up a clock and data recovery circuit, wherein the method includes: recovering a clock signal and data from an analog signal in a first clock and data recovery circuit, wherein the first clock and data recovery circuit has a first phase detector with at least one of an adjustable offset or an adjustable gain; recovering the clock signal and the data from the analog signal in a second clock and data recovery circuit, wherein the second clock and data recovery circuit has a second phase detector with at least one of an adjustable offset or an adjustable gain; providing recovered data from the first clock and data recovery circuit to one or more circuits that use the recovered data; adaptively adjusting at least one of the adjustable offset or the adjustable gain of the second clock and data recovery circuit to generate at least one of an adjustable offset setting or an adjustable gain setting; and applying the at least one of the adjustable offset setting or the adjustable gain setting obtained from adaptive adjustment of the second clock and data recovery circuit to the first clock and data recovery circuit.

One embodiment includes an apparatus for setting up a clock and data recovery circuit, wherein the apparatus includes: a first clock and data recovery circuit having an input and an output, wherein the input is coupled to an input node, wherein the first clock and data recovery circuit has a first phase detector with at least one of an adjustable offset or an adjustable gain; a second clock and data recovery circuit having an input and an output, wherein the input is coupled to the input node, wherein the second clock and data recovery circuit has a second phase detector with at least one of an adjustable offset or an adjustable gain; means for providing recovered data from the first clock and data recovery circuit to one or more circuits that use the recovered data; a means for adaptively adjusting at least one of the one or more configurable characteristics of the second clock and data recovery circuit; and means for applying the at least one of the adjustable offset setting or the adjustable gain setting obtained from adaptive adjustment of the second clock and data recovery circuit to the first clock and data recovery circuit.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

In this description, reference is made to the drawings in which like reference numerals indicate identical or functionally similar elements.

Although particular embodiments are described herein, other embodiments of the invention, including embodiments that do not provide all of the benefits and features set forth herein, will be apparent to those of ordinary skill in the art.

Returning to FIG. 3A, the CDR receiver 202 can have adjustable parameters that affect its complexity configuration and power consumption and one or more parameters that do not affect its complexity configuration. Selection of values for parameters that affect a CDR receiver's complexity configuration and power consumption are discussed in the co-pending related application. In the illustrated embodiment, these complexity-related parameters are: (1) # ADC Samplers, which corresponds to the number of samplers, or comparators, in a flash ADC, or equivalently, the effective number of bits in any generalized ADC; (2) # FFE Taps, which corresponds to the number of finite impulse response (FIR) filter taps for the feedforward equalizer (FFE) 306; (3) #DFE Taps, which corresponds to the number of filter taps for the decision feedback equalizer (DFE) 310; and (4) the LMS Cursor position, which determines the position of the "cursor", or peak of the filter response for the combination FFE/DFE and sets how many filter taps are used to equalize pre-cursor and post-cursor distortion. For a given number of FFE/DFE filter taps, different channels will benefit differently from the distribution of the number of pre-cursor and post-cursor taps.

In the illustrated embodiment, the one or more parameters that do not affect the power consumption include, but are not limited to, the following: (1) a phase detector offset, which corresponds to an offset adjustment for of the phase detector (PD) 314; and a phase detector gain, which corresponds to the gain of the amplifier 318, which is in the signal path with the PD 314.

Note the relationship of the Tx clock signal to the ADC clock signal. In the system shown in FIG. 2, the ADC clock signal is controlled to be synchronous to the data, and accordingly is a multiple in frequency of the Tx clock signal. It can be any multiple of the Tx clock, but the most efficient case is when the ADC clock signal is the same frequency as the incoming data (which is the same as the Tx clock). This case is referred to as "Baud-Rate Sampling."

Note that the ADC clock frequency and phase should be determined only from information contained in the digitized data stream itself. A feedback control system is constructed that examines the digitized waveform and controls the frequency and phase of an oscillator until the control system determines that the ADC clock is locked to the incoming data stream and sampling at the proper phase. This control loop is referred to as the "Timing Path." The block that computes the phase of the sampling clock relative to the phase of the data is referred to as a phase detector 314 (FIG. 3A).

As a block in the timing path, the phase detector 314 has an offset and gain value. For the best performance, there exist optimal values for the offset and gain. However, relatively good values that exhibit less than the best performance obtained from optimal values can also be applicable. Phase detector errors can also be referred to as timing errors.

Figure 4:
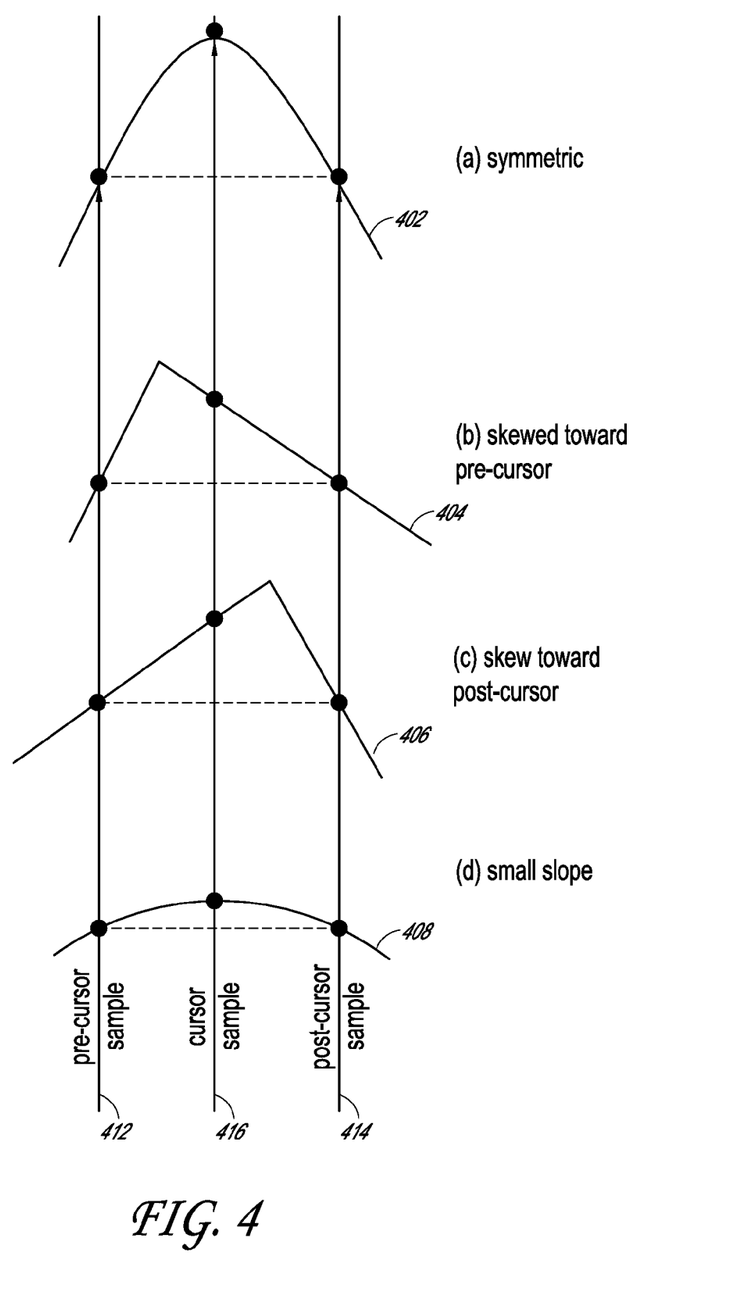
FIG. 4 illustrates examples of possible impulse responses for the channel.

FIG. 4 illustrates examples of possible impulse responses for the channel 104 (FIG. 1). Applicants have recognized that there are situations in which purposely locating the cursor sample off of the Mueller-Muller estimated peak can give improved performance versus on the Mueller-Muller estimated peak. Voltages are represented along a vertical axis, and time is represented along a horizontal axis.

Example (a) of FIG. 4 illustrates an impulse response 402 that is symmetric about a main cursor sample 416. Example (b) of FIG. 4 illustrates an impulse response 404 that is skewed towards a pre-cursor sample 412. Example (c) of FIG. 4 illustrates an impulse response 406 that is skewed towards a post-cursor sample 414. Example (d) of FIG. 4 illustrates an impulse response 408 that has relatively low gain.

For relatively good bit error rate (BER) performance, the main cursor sample 416 can be taken at the peak of the impulse responses 402, 404, 406, 408. While a better cursor position may be elsewhere, FIG. 4 illustrates how the vertical position (magnitude) of the main cursor sample 416 is dependent on the symmetry of the impulse response, which in turn is dependent on the characteristics of the channel 104 (FIG. 1). In the illustrated examples, the pre-cursor sample 412 and the post-cursor sample 414 are taken at the same vertical level (voltage), and the main cursor sample 416 is sampled at a time in between the pre-cursor sample 412 and the post-cursor sample 414 as viewed horizontally.

With the symmetric impulse response 402 of example (a), the main cursor sample 416 is taken at the peak of the impulse response 402 for relatively good performance. With the unequal slopes of the impulse response 404 of example (b), the main cursor sample 416 is taken after the actual peak when sampled according to Mueller-Muller techniques. With the unequal slopes of the impulse response 406 of example (c), the main cursor sample 416 is taken before the actual peak when sampled according to Mueller-Muller techniques. Examples (b) and (c) result in a static phase error for a phase detector. The impulse response 408 of example (d) illustrates yet another different slope characteristic that results in gain variation in a loop transfer response.

As illustrated in FIG. 4, the position of the cursor sample can vary depending on the slope characteristics of the impulse response of the particular channel 104 (FIG. 1) to which the receiver 106 (FIG. 1) is coupled. Because of the variability in cursor sample position, the performance of the timing path will also vary, and therefore the BER may not necessarily be improved or minimized for channels having non-symmetric or otherwise non-desirable slope impulse response characteristics. One aspect of embodiments of the invention is to correct these variations and non-idealities of the Mueller-Muller baud-rate phase detector.

Embodiments of the invention reduce the gain and offset error of the Mueller-Muller phase detector by introducing a second, parallel, replica CDR path onto which the offset and gain of the phase detector can be experimented, without affecting the performance of the main CDR path. The resulting performance of the replica path can be measured for each trial or experiment, and a relatively good offset and gain, such as the best offset and gain, chosen for use on the main CDR path.

Figure 5:
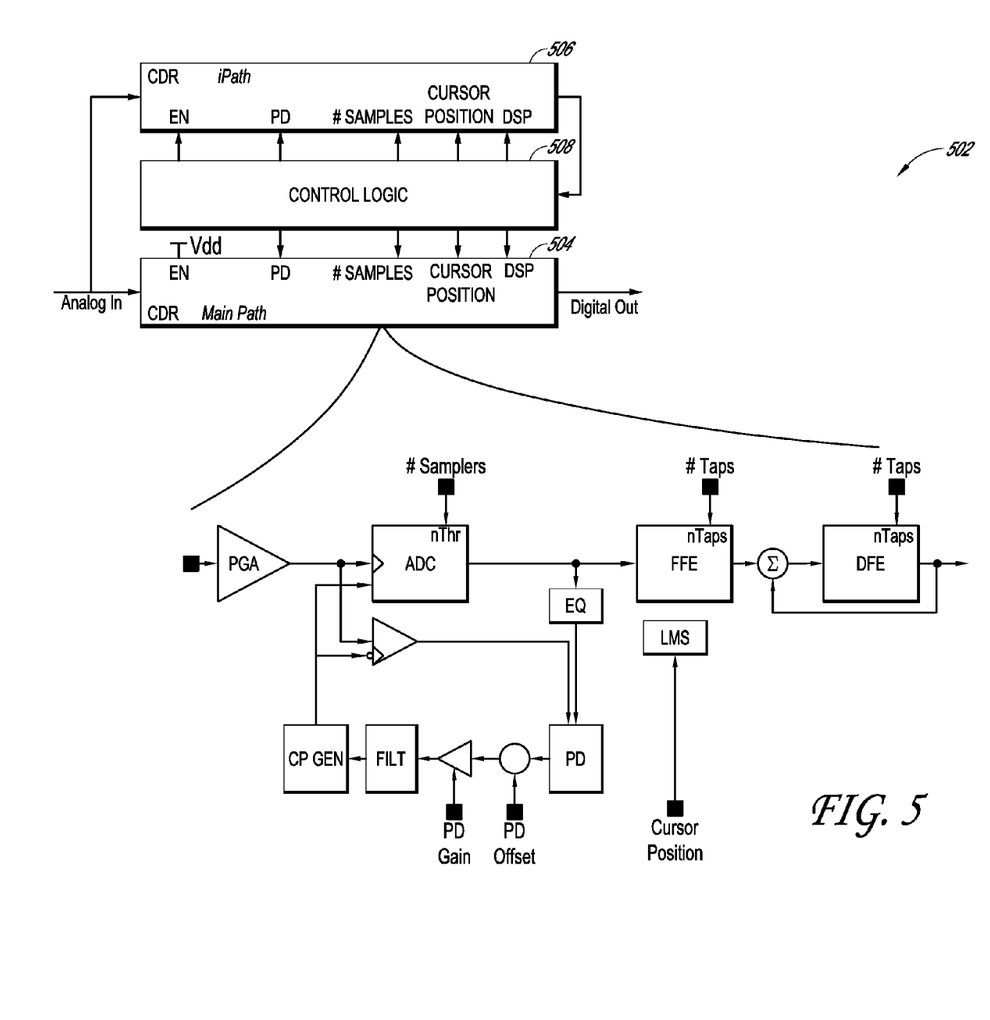
FIG. 5 illustrates a replica clock and data recovery (CDR) receiver architecture according to an embodiment of the invention.

FIG. 5 illustrates a replica clock and data recovery (CDR) receiver architecture 502 according to an embodiment of the invention. As illustrated in FIG. 5, the CDR receiver architecture 502 has two CDR circuits. The CDR receiver architecture includes a main CDR circuit 504, an iPath CDR circuit 506, and a control circuit or control logic 508. In the illustrated embodiment, the iPath CDR circuit 506 is a replica of the main CDR circuit 504, and each can be implemented by the same circuit design, such as the CDR receiver 202 described earlier in connection with FIG. 2. Preferably, the iPath CDR circuit 506 and the main CDR circuit 504 are implemented on the same integrated circuit so that they are subjected to the same process, voltage, and temperature (PVT) variations. However, portions of the iPath CDR circuit 506 and the main CDR circuit 504 can alternatively be on separate integrated circuits. For example, one or both of the PGA 302 or the ADC 304 can be on a separate integrated circuit. In addition, in certain embodiments, selected components of the iPath CDR circuit 506 and the main CDR circuit 504 can be shared. For example, in one embodiment, the PGA 302 can be shared between the iPath CDR circuit 506 and the main CDR circuit 504. In the illustrated embodiment, while the iPath CDR circuit 506 can provide decoded data symbols to the control logic 508 for analysis of the data eye or some other performance characteristic, the output of the iPath CDR circuit 506 is not provided as recovered data to further circuits that actually use the data.

The control logic 508 controls the operation of the two CDR circuits 504, 506 and performs the trial-and-error hypothesis testing in the iPath CDR circuit 506. While the two CDR circuits 504, 506 should be implemented in hardware, the control logic 508 can be implemented by software/firmware, by electronic hardware, or by a combination of software/firmware and electronic hardware. For example, the software/firmware can include computer-executable instructions stored in a tangible non-transitory computer-readable medium, which are then executed by a processor, such as a microprocessor, microcontroller, general-purpose digital signal processor, licensable core, or the like. The presence and use of the iPath CDR circuit 506 advantageously permits the receiver to continue to provide normal default reception in an uninterrupted manner via the main path while testing for improved settings for at least one of clock recovery or data recovery.

The replica path serves as a "laboratory" for the receiver configuration experiments under the control of the control logic 508. The main path, which in the illustrated embodiment presents the data to the downstream system, is preferably not disturbed while experiments are in process on the replica path.

In one embodiment, for each experimental setting of the iPath CDR circuit 506, the performance of the particular trial can be estimated by determining the data eye opening of the recovered data. There are various performance measures, including estimation of the bit error rate (BER) that can be inferred from a data eye opening. In one example, the magnitude of the eye-opening can be used as an estimate of the performance of the setting.

After a relatively good performing parameter, such as the best parameter, is found on the replica path, that parameter can then be set on the main path. The changing of the parameter on the main path should be done in a smooth manner so as not to disrupt the real data reception. Examples of parameters that can be adjusted can include one or more of the phase detector offset and the phase detector gain. Typically, a particular parameter will be analyzed separately from the others, but parameters can alternatively be analyzed in a group.

Figure 6:
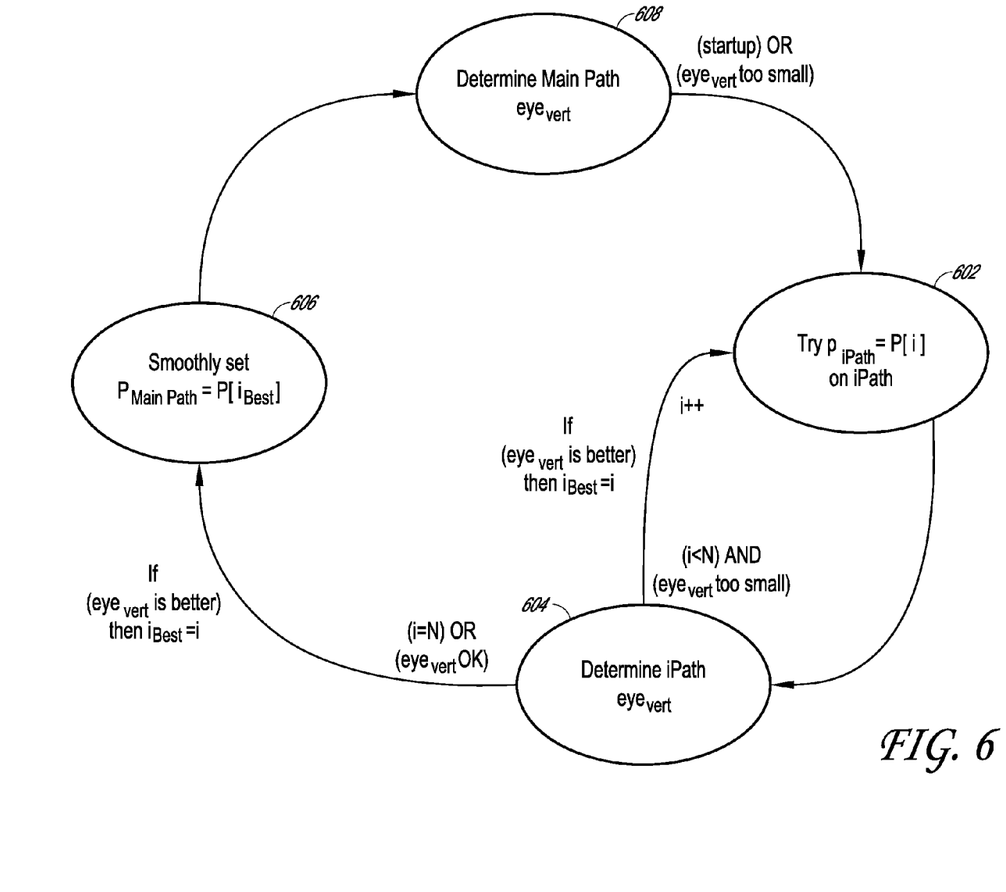
FIG. 6 is a state diagram that illustrates an example of a process for selecting a path parameter with a replica CDR path.

FIG. 6 is a state diagram that illustrates an example of a process for adaptively selecting a phase detector parameter with a replica CDR path. The process can be performed by the control logic 508 (FIG. 5). The illustrated process can be modified in a variety of ways. For example, in another embodiment, various portions of the illustrated process can be combined, can be rearranged in an alternate sequence, can be removed, or the like.

At the start of the process, it is assumed that both of the CDR circuits 504, 506 are enabled, receiving data, and generating data as an output. In the illustrated process, there are a total of N variations for the parameter that is being tested. The value for N can vary in a very broad range, and can vary depending on the particular parameter. For example, the number of phase detector offsets can vary from the number of phase detector gain settings to be tested.

The process begins by entering a state 602. The state 602 can be entered upon startup, for recalibration, for each separate parameter, and the like. Prior to entering the state 602, a loop counter i is initialized to 1. The loop counter i tracks the variations being tested. The variable $i_{Best}$ stores the value of the loop counter for the best setting encountered during the process and can also be initialized to 1.

In the state 602, the process applies a parameter setting P[i] using the iPath CDR circuit 506. The parameter P[i] represents the i-th variation of the phase detector offset or phase detector gain. The process advances from the state 602 to a state 604.

In the state 604, the process determines the vertical data eye opening of the iPath CDR circuit 506 with the current parameter setting P[i] applied to determine the performance of the current parameter setting P[i]. For example, the soft symbol output of the summing circuit 308 (FIG. 3A) for the iPath CDR circuit 506 can be monitored, and the vertical data eye opening can be determined by comparing the level of the high state or +1 to the level of the low state or −1. These levels can be averaged over many intervals. In alternative embodiments, a different metric for performance, such as a computation of a bit error rate, can be used to determine the performance of the current parameter setting P[i]. A slicer in the DFE 310 generates the hard symbol output that corresponds to the digital output.

If there remain additional settings for test, as can be indicated by the loop counter i having a value that is less than the value for N, and if a sufficiently good performing setting has not yet been found, the process returns from the state 604 to the state 602 to try another parameter setting P[i]. In addition, if the parameter setting P[i] that had just been tested has better performance than previous settings, the value for the loop counter i can be stored in the variable $i_{Best}$. Also, the loop counter i can be incremented as indicated by the statement i++ for processing with the next parameter setting P[i].

If the last parameter setting P[N] has been tested or if the vertical data eye opening is sufficiently high, the process proceeds from the state 604 to a state 606. For example, the magnitude of the vertical data eye opening can be compared to a predetermined amount that is associated with a particular BER that is appropriate for the application. By exiting from the state 604 early, the process can select a setting that has good enough performance in a relatively fast manner. In an alternative embodiment, the extra step of checking whether the vertical data eye opening is sufficiently high can be skipped, and the process can check all the parameter settings in a brute force manner and later select a phase detector offset or phase detector gain that has exhibits sufficiently good performance. In addition, if the parameter setting P[i] that had just been tested has better performance than previous settings, the value for the loop counter i can be stored in the variable $i_{Best}$.

In the state 606, the process applies the parameter P[$i_{Best}$], which was determined via testing on the iPath CDR circuit 506, to the main CDR circuit 504. In one embodiment, the control logic 508 takes care to apply the new setting smoothly, such as gradually or incrementally from the previous parameter setting to the new parameter setting so as not to disturb the recovered data stream. The process then advances from the state 606 to a state 608.

In the state 608, the process determines the main path's vertical data eye characteristics, which should be similar to the iPath's vertical data eye characteristics to determine whether further processing is warranted. For example, additional parameters can be adjusted. When the iPath CDR circuit 506 is not being used, it can be disabled via control of the enable input (EN) to save power.

The process can be repeated as desired. Either the main path or the iPath can be used to monitor the performance of the main path (assuming the same settings are applied) and based on the performance, such as if the performance falls below a threshold amount, the process can be re-executed for updating of the parameters.

The cursor position for the FFE/DFE filter and values for the sampler thresholds of the ADCs can also be adaptively adjusted using the described process or an alternative adaptive adjustment process, such as a conventional process.

Figure 7:
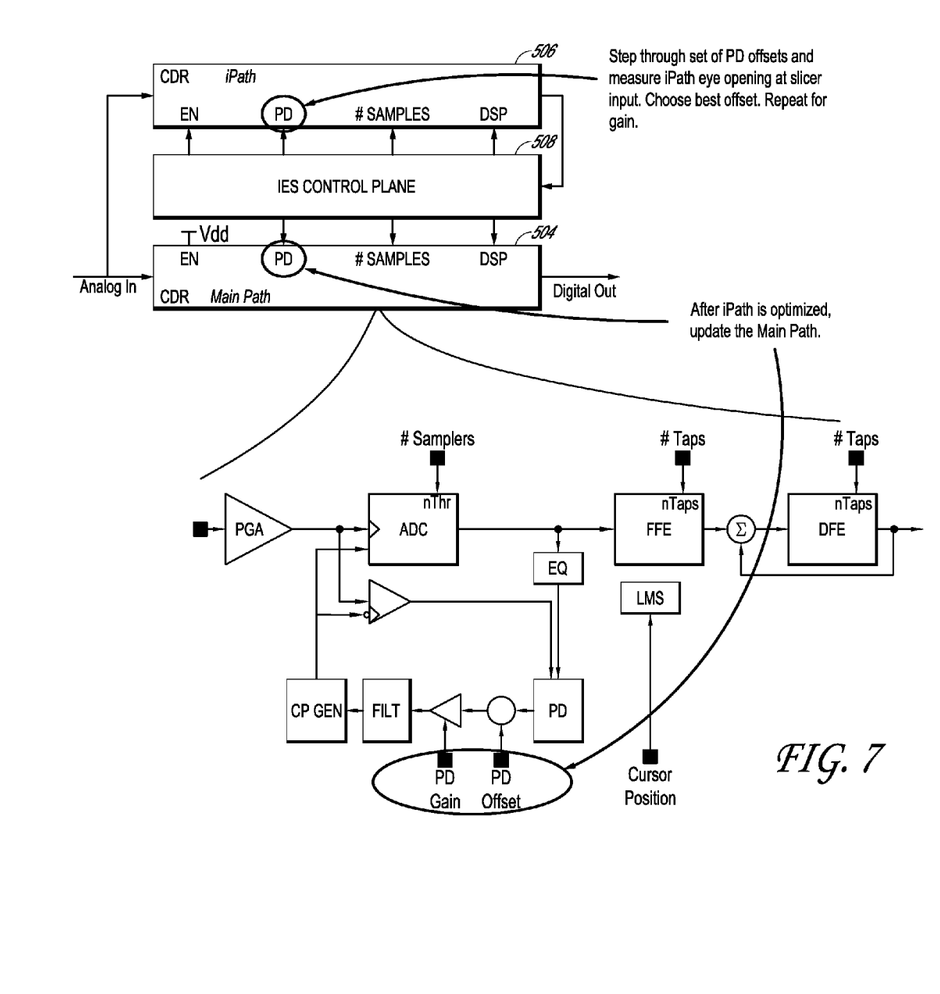
FIG. 7 illustrates an architectural view of adjustments to a phase detector offset and a phase detector gain.

FIG. 7 illustrates an architectural view of adjustments to a phase detector offset and a phase detector gain. For example, the procedure outlined in FIG. 6 can be used to adjust the phase detector offset or the phase detector gain. FIG. 7 illustrates the main CDR circuit 504, the iPath CDR circuit 506, and the control logic 508 described earlier in connection with FIG. 5.

Both the main CDR circuit 504 and the iPath CDR circuit 506 receive the same analog data stream as inputs. The control logic 508 experiments with different settings for the phase detector offset or the phase detector gain of the iPath CDR circuit 506. In the illustrated embodiment, the vertical data eye opening is determined to assess the performance of a particular setting. Other techniques can be used, such as analysis of a bit error rate, can alternatively be used. By using an analysis technique such as a vertical eye opening or a bit error rate, the constraint of selecting a cursor based on precursor and post-cursor levels being the same is removed and the performance of the main CDR circuit 504 can be improved, particularly when the slope of the impulse response is not symmetric or when the gain of the impulse response is less than ideal.

Advantageously, by experimenting with the settings in a replica path, that is, the iPath CDR circuit 506, the process of receiving data through the main CDR circuit 504 is unaffected. After relatively good performing settings are found for the phase detector offset and/or gain using the iPath CDR circuit 506, these settings can be applied to the main CDR circuit 504.

Figure 8:
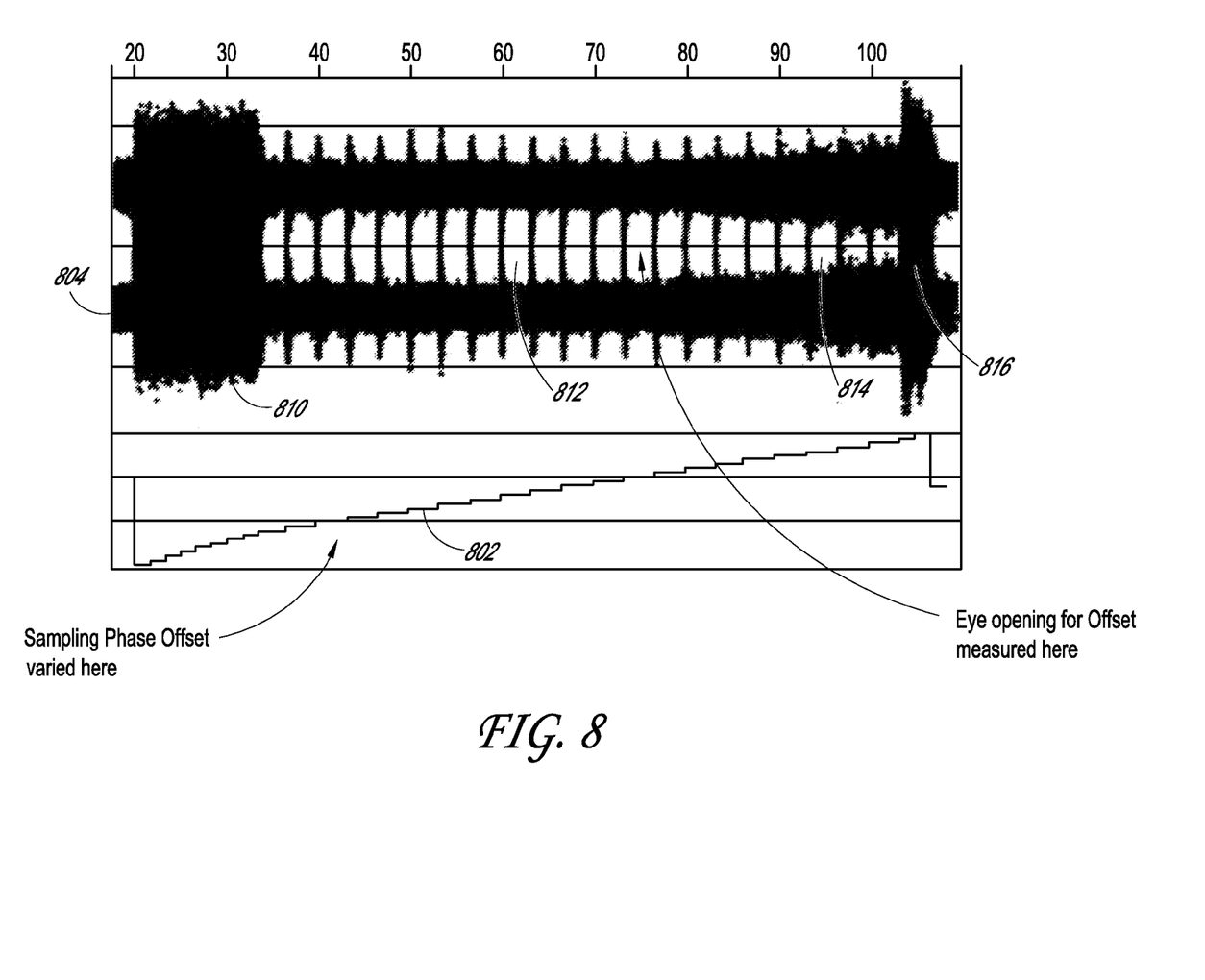
FIG. 8 illustrates results of a transient simulation.

FIG. 8 illustrates results of a transient simulation. A stepped waveform 802 in the lower chart represents various phase detector offset settings. In this instance, all of the settings were tried. The waveform 804 in the upper chart represents the output of the iPath CDR circuit 506 that is provided as an input to the control logic 508. As illustrated by FIG. 8, a portion 810 of the waveform 804 does not have an appreciable data eye, because it corresponds to a transitioning portion of the signal. A portion 812 illustrates a relatively good vertical eye opening. A portion 814 corresponds to a data eye, but the vertical opening is relatively small. A portion 816 again corresponds to an absence of a data eye. The data eye measurements can be averaged over many intervals to reduce the amount of noise in the measurement.

The replica path described in the foregoing is created in "space," that is, there are actually two CDR paths. In an alternative embodiment, the main path is multiplexed in "time," that is, the main path itself is used at certain times to run the experiments. Of course, when it is being used for experiments, the data output could become corrupted, so multiplexing in time may only be practical at power-up or other times when the main path output is not needed.

In an alternative embodiment, a multiplexer circuit (not shown) can be used to select a hard symbol output of either the first clock and data recover circuit 504 or the second clock and data recovery circuit 506 for provision of the digital output to circuits that use the data as opposed to the control logic 508. Similarly, another multiplexer can also be used at the input of the control logic to select the other of the first CDR circuit 504 or the second CDR circuit 506 during adaptation. The multiplexer can be implemented by, for example, three-state gates. In this manner, either CDR circuit can be used for data or for adaptation.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

As used herein, a "node" refers to any internal or external reference point, connection point, junction, signal line, conductive element, or the like at which a given signal, logic level, voltage, data pattern, current, or quantity is present.

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
   a first clock and data recovery circuit having an input and an output, wherein the input is coupled to an input node, wherein the first clock and data recovery circuit has a first phase detector with at least one of an adjustable offset or an adjustable gain;
   a second clock and data recovery circuit having an input and an output, wherein the input is coupled to the input node, wherein the second clock and data recovery circuit has a second phase detector with at least one of an adjustable offset or an adjustable gain; and
   a control circuit communicatively coupled to each of the first clock and data recovery circuit and the second clock and data recovery circuit for control of at least one or the offset or the gain settings of phase detectors of the clock and data recovery circuits, wherein the control circuit is coupled to at least the output of the second clock and data recovery circuit;
   wherein the output of the first clock and data recovery circuit is at least temporarily configured to provide recovered data as an input to circuits other than the control circuit while at least one of the one or more configurable characteristics of the second clock and data recovery circuit is being adaptively adjusted by the control circuit, wherein the second clock and data recovery circuit is not configured to provide recovered data as an input to circuits that would use the recovered data other than the control circuit.

2. The apparatus of claim 1:
   wherein the first clock and data recovery circuit is permanently configured to provide recovered data;
   wherein the control circuit is further configured to apply the one or more complexity-related parameter settings obtained from adaptive adjustment of the second clock and data recovery circuit to the first clock and data recovery circuit.

3. The apparatus of claim 2, wherein the control circuit is further configured to enable the second clock and data recovery circuit at least during adaptive adjustment, and wherein the control circuit is configured to disable the second clock and data recovery circuit when not in use.

4. The apparatus of claim 1, further comprising a multiplexer that is configured to select between at least one of the first clock and data recovery circuit or the second clock and data recovery circuit for provision of the recovered data to circuits other than the control circuit, wherein the control circuit is configured to adaptively adjust the one or more configurable characteristics of a clock and data recovery circuit that is not selected by the multiplexer.

5. The apparatus of claim 4, wherein the control circuit is further configured to monitor operating performance characteristics via the clock and data recovery circuit that is not configured to provide recovered data to circuits, and to update the at least one of the adjustable offset or adjustable gain settings upon a determination that operating performance has fallen below a threshold amount.

6. A method for setting up a clock and data recovery circuit, the method comprising:
   recovering a clock signal and data from an analog signal in a first clock and data recovery circuit, wherein the first clock and data recovery circuit has a first phase detector with at least one of an adjustable offset or an adjustable gain;
   recovering the clock signal and the data from the analog signal in a second clock and data recovery circuit, wherein the second clock and data recovery circuit has a second phase detector with at least one of an adjustable offset or an adjustable gain;

providing recovered data from the first clock and data recovery circuit to one or more circuits that use the recovered data;

not providing recovered data from the second clock and data recovery circuit as an input to circuits that would use the recovered data other than a control circuit, wherein the control circuit controls at least one or the offset or the gain settings of phase detectors of the clock and data recovery circuits;

adaptively adjusting at least one of the adjustable offset or the adjustable gain of the second clock and data recovery circuit to generate at least one of an adjustable offset setting or an adjustable gain setting; and applying the at least one of the adjustable offset setting or the adjustable gain setting obtained from adaptive adjustment of the second clock and data recovery circuit to the first clock and data recovery circuit.

7. The method of claim 6, wherein the first clock and data recovery circuit is permanently configured to provide recovered data.

8. The method of claim 7, further comprising enabling the second clock and data recovery circuit at least during adaptive adjustment, and disabling the second clock and data recovery circuit when not in use.

9. The method of claim 6, further comprising selecting with a multiplexer between at least one of the first clock and data recovery circuit or the second clock and data recovery circuit for provision of the recovered data to the one or more circuits that use the recovered data, and adaptively adjusting the at least one of the adjustable offset setting or the adjustable gain setting of a clock and data recovery circuit that is not selected by the multiplexer.

10. The method of claim 9, further comprising:
monitoring operating performance characteristics via the clock and data recovery circuit that is not providing recovered data to circuits; and
updating the at least one of the adjustable offset setting or the adjustable gain setting upon a determination that operating performance has fallen below a threshold amount.

11. An apparatus for setting up a clock and data recovery circuit, the apparatus comprising:
a first clock and data recovery circuit having an input and an output, wherein the input is coupled to an input node, wherein the first clock and data recovery circuit has a first phase detector with at least one of an adjustable offset or an adjustable gain;
a second clock and data recovery circuit having an input and an output, wherein the input is coupled to the input node, wherein the second clock and data recovery circuit has a second phase detector with at least one of an adjustable offset or an adjustable gain;
a means for providing recovered data from the first clock and data recovery circuit to one or more circuits that use the recovered data;
a means for adaptively adjusting at least one of the one or more configurable characteristics of the second clock and data recovery circuit, wherein the second clock and data recovery circuit is not configured to provide recovered data as an input to circuits that would use the recovered data other than the adaptively adjusting means; and
a means for applying the at least one of the adjustable offset setting or the adjustable gain setting obtained from adaptive adjustment of the second clock and data recovery circuit to the first clock and data recovery circuit.

12. The apparatus of claim 11, wherein the first clock and data recovery circuit is permanently configured to provide recovered data.

13. The apparatus of claim 12, further comprising a means for enabling the second clock and data recovery circuit at least during adaptive adjustment and disabling the second clock and data recovery circuit when not in use.

14. The apparatus of claim 11, further comprising a means for selecting with a multiplexer between at least one of the first clock and data recovery circuit or the second clock and data recovery circuit for provision of the recovered data to circuits that use the recovered data, and wherein the adaptively adjusting means adaptively adjusts the at least one of the adjustable offset or the adjustable gain of a clock and data recovery circuit that is not selected by the multiplexer.

* * * * *